US 8,946,975 B2

(12) United States Patent
Ariji et al.

(10) Patent No.: US 8,946,975 B2
(45) Date of Patent: Feb. 3, 2015

(54) PIEZOELECTRIC VIBRATING PIECE AND PIEZOELECTRIC DEVICE

(71) Applicant: Nihon Dempa Kogyo Co., Ltd., Tokyo (JP)

(72) Inventors: Takumi Ariji, Saitama (JP); Takehiro Takahashi, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 326 days.

(21) Appl. No.: 13/662,537

(22) Filed: Oct. 28, 2012

(65) Prior Publication Data

US 2013/0106247 A1    May 2, 2013

(30) Foreign Application Priority Data

Nov. 2, 2011    (JP) ................. 2011-240801

(51) Int. Cl.
*H01L 41/053*    (2006.01)
*H03H 9/02*    (2006.01)
*H03H 9/15*    (2006.01)

(52) U.S. Cl.
CPC .. *H03H 9/02* (2013.01); *H03H 9/15* (2013.01)
USPC ........... 310/365; 310/348; 310/363; 310/364; 310/366

(58) Field of Classification Search
CPC ... H01L 41/39; H01L 41/083; H01L 41/0926; H01L 41/047; H03H 9/132; H03H 9/131
USPC .......................... 310/348, 363, 364, 365, 366
See application file for complete search history.

(56) References Cited

U.S. PATENT DOCUMENTS

| 7,732,995 | B2* | 6/2010 | Tsuchido et al. | 310/348 |
| 2009/0256449 | A1* | 10/2009 | Nishimura et al. | 310/348 |
| 2010/0327706 | A1* | 12/2010 | Mizusawa | 310/365 |
| 2011/0260586 | A1* | 10/2011 | Kawase et al. | 310/365 |
| 2012/0133248 | A1* | 5/2012 | Kusano | 310/348 |
| 2012/0176004 | A1* | 7/2012 | Mizusawa et al. | 310/348 |
| 2012/0235762 | A1* | 9/2012 | Il et al. | 331/158 |

FOREIGN PATENT DOCUMENTS

JP    2007-214942    8/2007

* cited by examiner

*Primary Examiner* — Derek Rosenau
*Assistant Examiner* — Bryan Gordon
(74) *Attorney, Agent, or Firm* — Jianq Chyun IP Office

(57) ABSTRACT

A piezoelectric vibrating piece includes an excitation unit in a rectangular shape, a framing portion, and a connecting portion. The excitation unit includes two principal surfaces, a pair of excitation electrodes on the principal surfaces, a first side extending in a first direction, and a second side extending in a second direction. The second side is longer than the first side, and is perpendicular to the first direction. The framing portion surrounds the excitation unit. The connecting portion connects the excitation unit to the framing portion. The connecting portion has a third side which is connected to the first side and extends in the first direction and a fourth side which is connected to the framing portion and extends in the first direction. A thickness of the connecting portion is thinner than that of the framing portion. The third side has a different length from that of the fourth side.

9 Claims, 13 Drawing Sheets

PIEZOELECTRIC VIBRATING PIECE AND PIEZOELECTRIC DEVICE

CROSS-REFERENCE TO RELATED APPLICATIONS

This application claims the priority benefit of Japan application serial no. 2011-240801, filed on Nov. 2, 2011. The entirety of the above-mentioned patent application is hereby incorporated by reference herein and made a part of this specification.

TECHNICAL FIELD

This disclosure relates to a piezoelectric vibrating pieces and a piezoelectric device that reduce influence of stresses on excitation units.

DESCRIPTION OF THE RELATED ART

A piezoelectric vibrating piece including an excitation unit which vibrates at a predetermined frequency, a framing portion which surrounds a peripheral area of the excitation unit, and a connecting portion which connects the excitation unit and the framing portion together, is known. A piezoelectric device is formed by bonding a lid plate and a base plate on front and back sides of the framing portion of the piezoelectric vibrating piece. The piezoelectric device is used being mounted on a printed circuit board or a similar device. The piezoelectric device may undergo stress on the printed circuit board. The stress on the piezoelectric device affects the piezoelectric vibrating piece, thus changing a characteristic of the vibration frequency of the excitation unit.

To solve this problem, for example, Japanese Unexamined Patent Application Publication No. 2007-214942 discloses an expectation that a saw tooth-shaped notch in a connecting portion reduces stress transferring from the framing portion to the excitation unit. The publication discloses as follows. In the case where the notch has a depth that is equal to or more than half of the framing portion, the framing portion is connected to the excitation unit not in a straight line. In this case, an actual transfer distance of heat and stress increases, thus ensuring a buffering effect.

However, the piezoelectric vibrating piece in Japanese Unexamined Patent Application Publication No. 2007-214942 has the notch in the connecting portion. This possibly causes a vulnerability to dropping impact and similar cause. Nowadays, the piezoelectric vibrating piece has become thinned to ensure a downsized piezoelectric device. Forming the notch in the connecting portion, which has the lowest resistance to impact in the piezoelectric vibrating piece, may reduce impact resistance of the piezoelectric vibrating piece. Japanese Unexamined Patent Application Publication No. 2007-214942 discloses a piezoelectric vibrating piece where the excitation unit is supported at both ends. The piezoelectric vibrating piece includes connecting portions at respective opposite sides of the excitation unit. In contrast, a piezoelectric vibrating piece that is supported at one end has one connecting portion alone at one side of the excitation unit. This configuration has a further reduced impact resistance. In view of this, there is a need for a piezoelectric vibrating piece that reduces influence of stress on the excitation unit, and also ensures sufficient impact resistance.

A need thus exists for a piezoelectric vibrating piece and a piezoelectric device, which are not susceptible to the drawback mentioned above.

SUMMARY

According to a aspect of the piezoelectric vibrating piece, the piezoelectric vibrating piece includes an excitation unit in a rectangular shape, a framing portion, and a connecting portion. The excitation unit includes a pair of principal surfaces, a pair of excitation electrodes formed on the pair of principal surfaces, a first side that extends in a first direction, a second side that extends in a second direction where the second side is longer than the first side and the second direction being perpendicular to the first direction. The framing portion surrounds the excitation unit. The connecting portion connects the excitation unit to the framing portion. The connecting portion has a third side and a fourth side. The third side is connected to the first side and extends in the first direction. The fourth side is connected to the framing portion and extends in the first direction. A thickness of the connecting portion is thinner than a thickness of the framing portion. The third side has a different length from that of the fourth side.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Each preferred embodiment of this disclosure is described in detail below by referring to the accompanying drawings. It will be understood that the scope of the disclosure is not limited to the described embodiments, unless otherwise stated.

Configuration of a Piezoelectric Device 100 According to a First Embodiment

Figure 1:
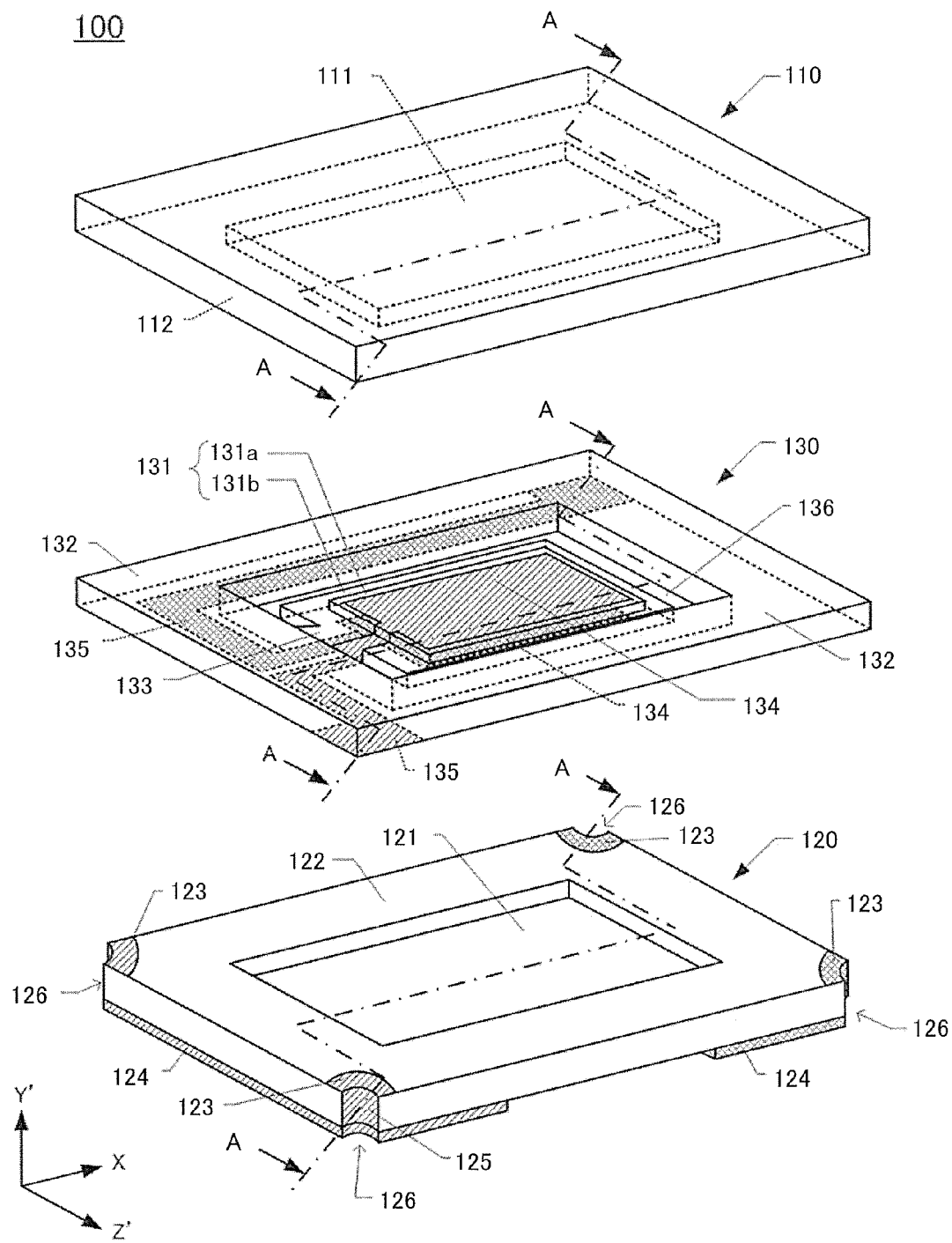
FIG. 1 is an exploded perspective view of a piezoelectric device 100.

FIG. 1 is an exploded perspective view of the piezoelectric device 100. The piezoelectric device 100 includes a lid plate 110, a base plate 120, and a piezoelectric vibrating piece 130. The piezoelectric vibrating piece 130 employs, for example, an AT-cut quartz-crystal vibrating piece. The AT-cut quartz-crystal vibrating piece has a principal surface (in the Y–Z plane) that is tilted by 35° 15' about the Y-axis of the crystallographic axis (XYZ) in the direction from the Z-axis to the Y-axis around the X-axis. In the following description, the new axes tilted with reference to the axis directions of the AT-cut quartz-crystal vibrating piece are denoted as the Y' axis and the Z' axis. Therefore, in the piezoelectric device 100, the longitudinal direction of the piezoelectric device 100 is referred to as the X axis direction, the height direction of the piezoelectric device 100 is referred to as the Y' axis direction, and the direction perpendicular to the X axis and the Y' axis directions is referred to as the Z' axis direction.

The piezoelectric vibrating piece 130 includes the excitation unit 131 which is formed in a rectangular shape and vibrates at a predetermined frequency, a framing portion 132 which surrounds the excitation unit 131, and one connecting portion 133 which connects the framing portion 132 and the excitation unit 131 together. A region, which is other than the connecting portion 133, between the excitation unit 131 and the framing portion 132 forms a through hole 136 that passes through the piezoelectric vibrating piece 130 in the Y' axis direction. The excitation unit 131 includes the excitation electrodes 134 on the surfaces at the +Y' axis side and -Y' axis side. The excitation unit 131 includes a mesa region 131a with the excitation electrodes 134 and a peripheral region 131b, which is formed around the mesa region 131a and has a smaller thickness in the Y' axis direction than that of the mesa region 131a. From the excitation electrodes 134 on the surface at the +Y' axis side and the surface at the -Y' axis side, respective extraction electrodes 135 are extracted through the connecting portion 133 to the surface at the -Y' axis side of the framing portion 132.

The base plate 120 is disposed at the -Y' axis side of the piezoelectric vibrating piece 130. The base plate 120 is formed in a rectangular shape that has long sides in the X axis direction and short sides in the Z' axis direction. The base plate 120 includes a pair of external electrodes 124 on the surface at the -Y' axis side. The external electrodes 124 are secured and electrically connected to a printed circuit board or the like via solder. This mounts the piezoelectric device 100 on the printed circuit board or the like. On side surfaces at four corners of the base plate 120, castellations 126 are formed, while castellation electrodes 125 are formed on the castellations 126. The base plate 120 includes a recess 121 on the surface at the +Y' axis side, while a bonding surface 122 is formed in a peripheral area of the recess 121. The bonding surface 122 includes connecting electrodes 123 in peripheral areas of the castellations 126 at the four corners. The connecting electrodes 123 are electrically connected to the external electrodes 124 via the castellation electrodes 125 on the castellation 126. The base plate 120 is bonded to the surface of the framing portion 132 at the -Y' axis side in the piezoelectric vibrating piece 130 via a sealing material 141 (see FIG. 2) on the bonding surface 122. The connecting electrodes 123 are electrically connected to the extraction electrodes 135 of the piezoelectric vibrating piece 130.

The lid plate 110 is disposed at the +Y' axis side of the piezoelectric vibrating piece 130. The lid plate 110 includes a recess 111 on its surface at the -Y' axis side, while a bonding surface 112 is formed in a peripheral area of the recess 111. The lid plate 110 is bonded to the surface of the framing portion 132 at the +Y' axis side in the piezoelectric vibrating piece 130 via the sealing material 141 (see FIG. 2) on the bonding surface 112.

Figure 2:
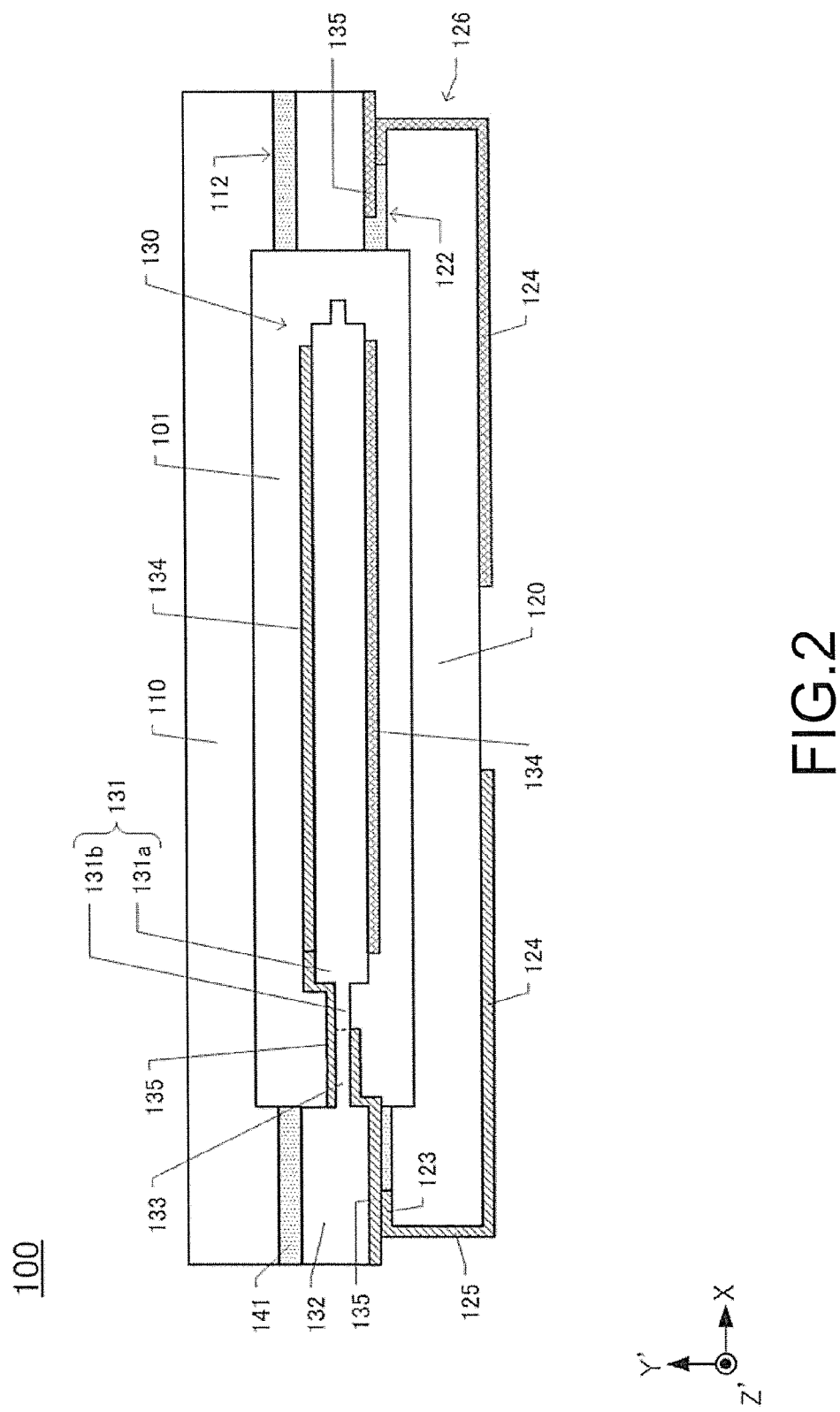
FIG. 2 is a cross-sectional view taken along the line A-A of FIG. 1.

FIG. 2 is a cross-sectional view taken along the line A-A of FIG. 1. The piezoelectric device 100 includes the piezoelectric vibrating piece 130 with the framing portion 132. The framing portion 132 has a surface with the lid plate 110 at the +Y' axis side. The framing portion 132 has a surface with the base plate 120 at the -Y' axis side. These form a cavity 101 inside the piezoelectric device 100. Further, the framing portion 132 of the piezoelectric vibrating piece 130, the bonding surface 112 of the lid plate 110, and the bonding surface 122 of the base plate 120 are mutually bonded with a sealing material 141. This configuration hermetically seals the cavity 101. When the piezoelectric vibrating piece 130 and the base plate 120 are bonded together, the extraction electrodes 135 which are formed on the surface of the framing portion 132 at the -Y' axis side, and the connecting electrodes 123 which are formed on the bonding surface 122 of the base plate 120, are electrically connected together. Thus, the respective excitation electrodes 134, which are formed on the +Y' axis side and the -Y' axis side of a mesa region 131a, are electrically connected to the external electrodes 124 via the extraction electrode 135, the connecting electrode 123, and the castellation electrode 125.

Figure 3A:
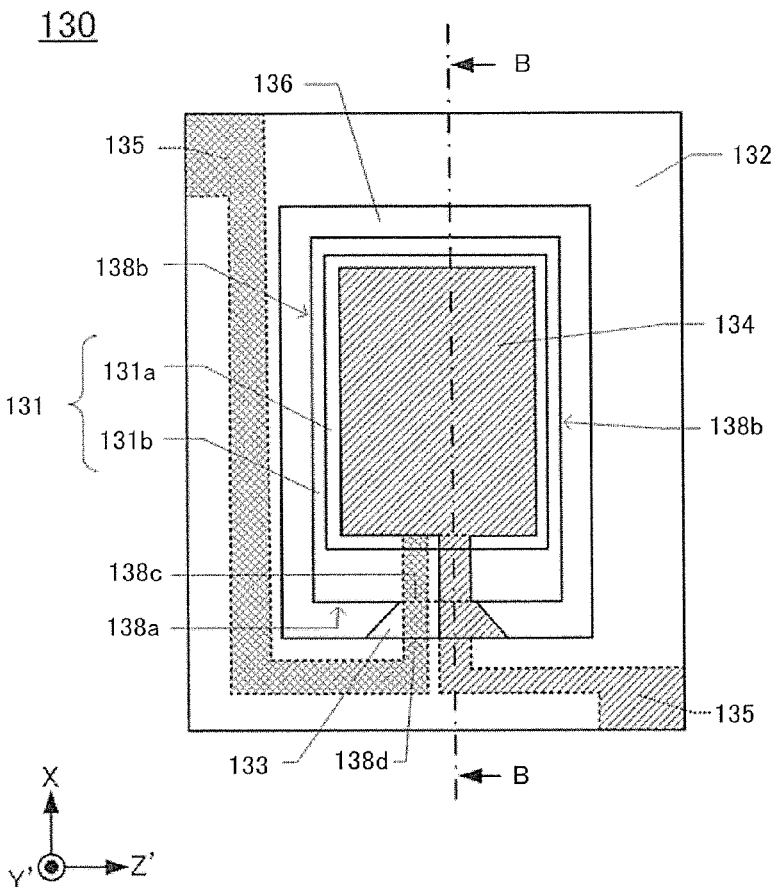
FIG. 3A is a plan view of a piezoelectric vibrating piece 130.

FIG. 3A is a plan view of the piezoelectric vibrating piece 130. The piezoelectric vibrating piece 130 includes the excitation unit 131 in a rectangular shape, the framing portion 132 which surrounds the excitation unit 131, and one connecting portion 133 which connects the excitation unit 131 and the framing portion 132 together. The excitation unit 131 includes a first side 138a which is a side of the excitation unit 131 at the -X axis side, and second sides 138b which are sides of the excitation unit 131 at the +Z' axis side and the -Z' axis side. The connecting portion 133 is formed in a trapezoid shape and includes a third side 138c which is a side at the +X axis side, and a fourth side 138d which is a side at the -X axis side and longer than the third side 138c. The third side 138c of the connecting portion 133 is connected to the center of the first side 138a in the excitation unit 131, and then extends from this center to the -X axis direction. Thus the fourth side 138d is connected to the framing portion 132. A region, which is other than the connecting portion 133, between the excitation unit 131 and the framing portion 132 forms a through hole 136 that passes through the piezoelectric vibrating piece 130 in the Y' axis direction. The excitation unit 131 has the peripheral region 131b that surrounds the mesa region 131a. From the excitation electrode 134 on the surface at the +Y' axis side of the mesa region 131a, the extraction electrodes 135 is extracted via the peripheral region 131b, the surface at the +Y' axis side of the connecting portion 133, the side surface at the +Z' axis side of the connecting portion 133, and the surface at the -Y' axis side of the connecting portion 133, to the corner portion at the +Z' axis side and −X axis side on the surface of the −Y' axis side of the framing portion 132. From the excitation electrode 134 (see FIG. 3B) on the surface at the −Y' axis side of the mesa region 131a, the extraction electrode 135 is extracted via the surfaces at the −Y' axis sides of the peripheral region 131b and the connecting portion 133 to the framing portion 132. The extraction electrode 135 further extends on the surface at the −Y' axis side of the framing portion 132 in the −Z' axis direction and the +X axis direction. The extraction electrode 135 is extracted to the corner portion at the +X axis side and −Z' axis side on the surface of the −Y' axis side of the framing portion 132.

Figure 3B:
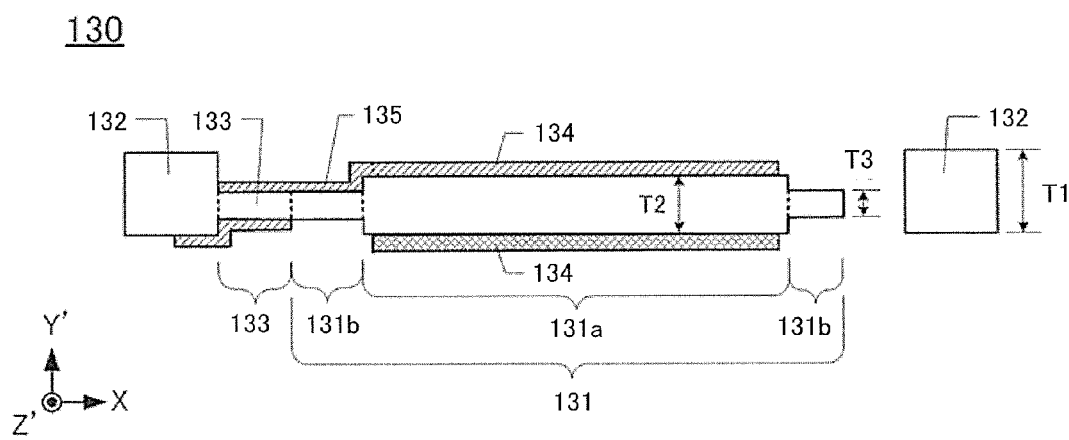
FIG. 3B is a cross-sectional view taken along the line B-B of FIG. 3A.

FIG. 3B is a cross-sectional view taken along the line B-B of FIG. 3A. Assume that in the piezoelectric vibrating piece 130, the framing portion 132 has a thickness T1 in the Y' axis direction, the mesa region 131a has a thickness T2 in the Y' axis direction, and the connecting portion 133 and the peripheral region 131b have a thickness T3 in the Y' axis direction. In the piezoelectric vibrating piece 130, the thickness T1 is thicker than the thickness T2 and the thickness T3, while the thickness T2 is thicker than the thickness T3. In the piezoelectric vibrating piece 130, for example, when a frequency is 40 MHz, the thickness T2 is formed to be 41.75 μm.

Simulation Results of the Piezoelectric Vibrating Piece 130

In the case where the piezoelectric devices are mounted on printed circuit boards, simulations were performed to calculate stresses on the piezoelectric vibrating pieces when the printed circuit boards are bent. The simulations were performed assuming two cases: one case (long side bend) where the printed circuit board is bent in the long side direction (X axis direction) of the piezoelectric device 100, and the other case (short side bend) where the printed circuit board is bent in the short side direction (Z' axis direction). The simulation results below describe a stress in the Z' axis direction. The simulation results of the piezoelectric vibrating pieces will be described below.

Figure 4A:
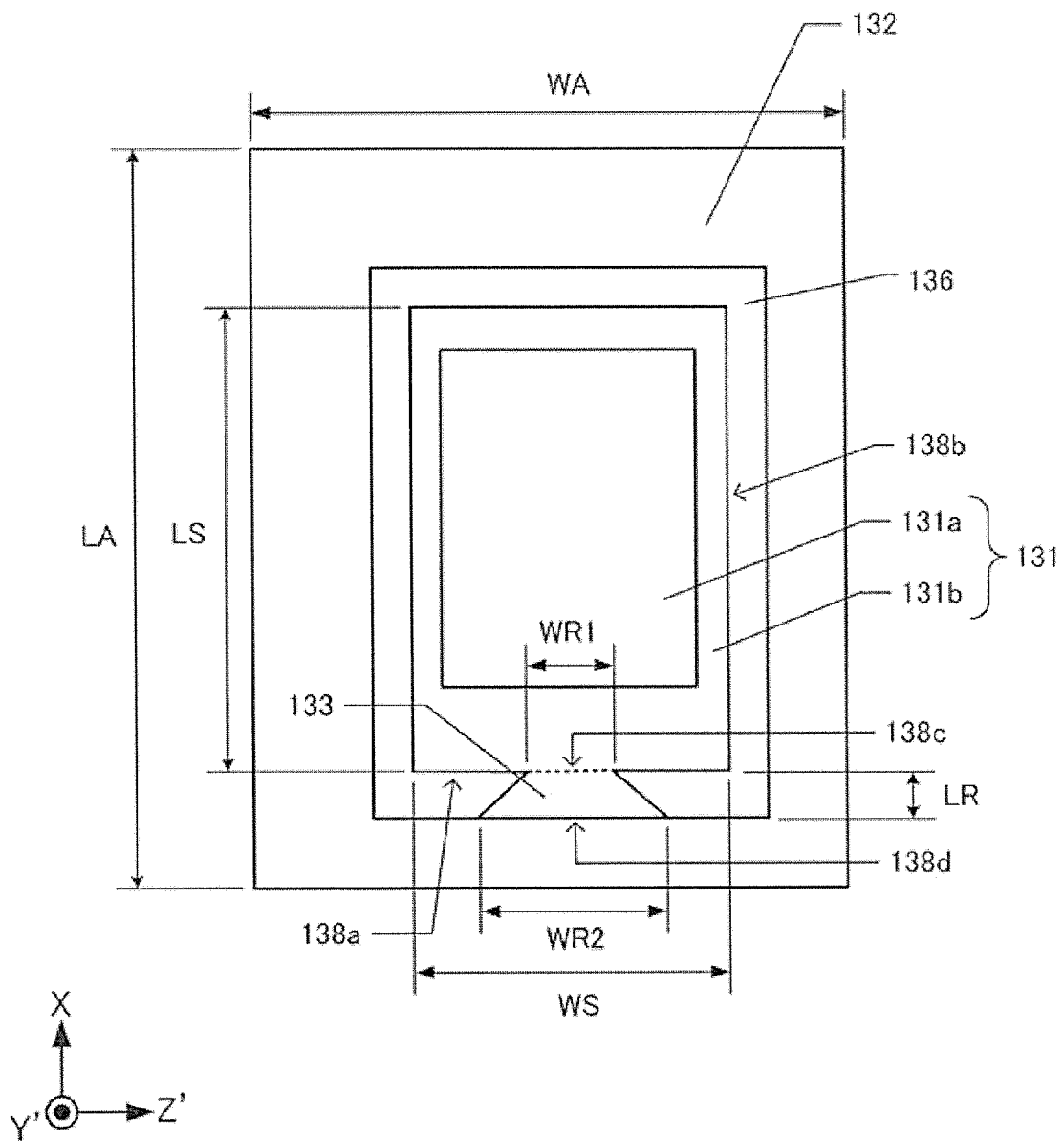
FIG. 4A is a plan view of the piezoelectric vibrating piece 130 without electrodes.

FIG. 4A is a plan view of the piezoelectric vibrating piece 130 without electrodes. Assume that in the piezoelectric vibrating piece 130, the framing portion 132 has a whole length WA in the Z' axis direction and a whole length LA in the X axis direction, the excitation unit 131 has the first side 138a with a length WS and the second side 138b with a length LS, the connecting portion 133 has the third side 138c with a length WR1, the fourth side 138d with a length WR2, and has a length LR in the X direction. The simulations were performed with the length LA of 2.0 mm, the length WA of 1.6 mm, the length LS of 1.3 mm, the length WS of 0.95 mm, the length LR of 0.2 mm, the length WR1 of 0.32 mm, and the length WR4 of 0.42 mm.

Figure 4B:
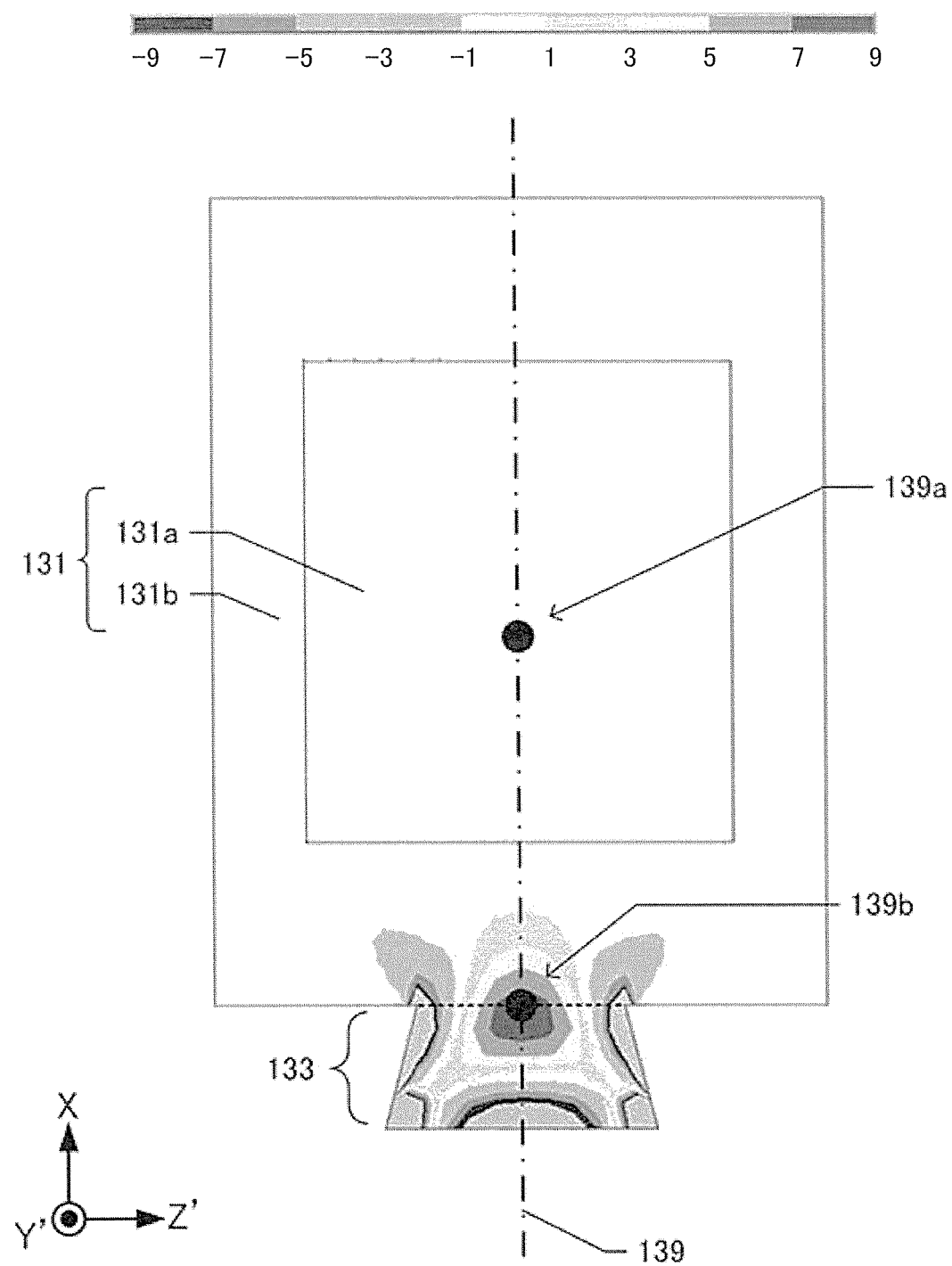
FIG. 4B is a simulation result of a short side bend of the piezoelectric vibrating piece 130.

FIG. 4B is the simulation result of the short side bend of the piezoelectric vibrating piece 130. FIG. 4B illustrates a plan view of the excitation unit 131 and the connecting portion 133 in the piezoelectric vibrating piece 130 alone. FIG. 4B illustrates that the color in the mesa region 131a (white) indicates a portion almost free from stress. Portions with a color darker than the white are in a state where a stress is applied. Additionally, portions with a color close to black are in a state where the largest stress is applied among the excitation unit 131 and the connecting portion 133. In FIG. 4B, the connecting portion 133 has a darker color. It is assumed that a large stress is applied to the connecting portion 133. From the connecting portion 133 toward the peripheral region 131b, the region with a thin color is extended, indicating that the region where a stress is applied is extended from the connecting portion 133 to the peripheral region 131b. Assume that the center point of the mesa region 131a is a point 139a, a straight line parallel to the X axis and going through the center point 139a is a straight line 139, and a point on the straight line 139 and an end portion at the −X axis side of the excitation unit 131 is the point 139b.

Figure 5A:
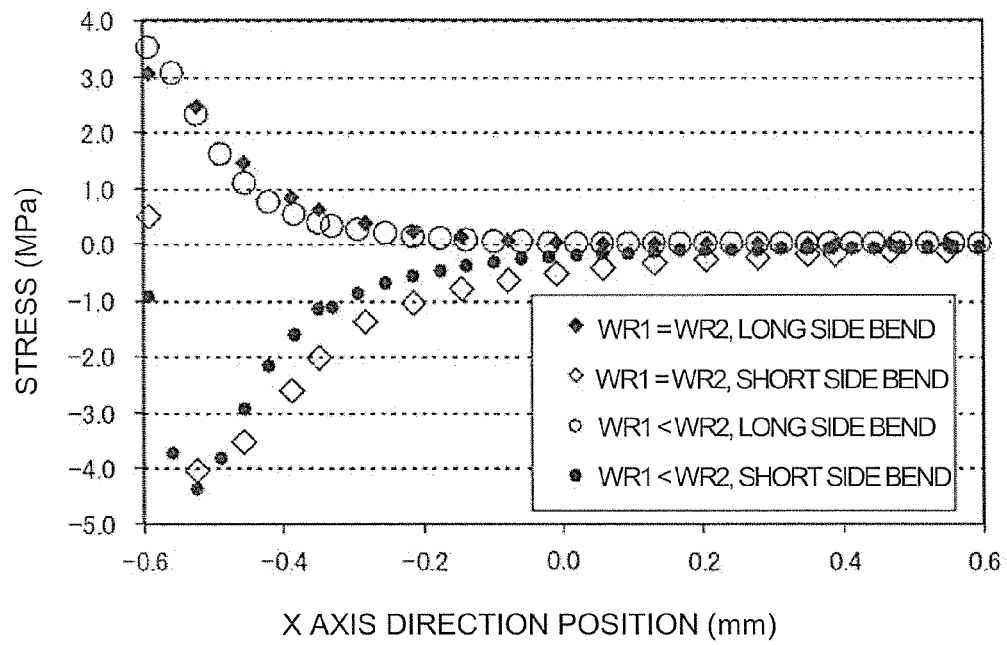
FIG. 5A is a graph illustrating stress distributions of an excitation unit 131 in the piezoelectric vibrating piece 130.

FIG. 5A is a graph illustrating stress distributions of the excitation unit 131 in the piezoelectric vibrating piece 130. FIG. 5A illustrates the stress distribution on the straight line 139 of FIG. 4B. The horizontal axis indicates an X axis direction position (mm). The vertical axis indicates a stress (MPa). Assume that the point 139a, which is the center point of in the mesa region 131a (see FIG. 4B), is 0.0 mm position in the X axis direction. A distance from the point 139a to the +X axis direction is expressed as a positive value. A distance from the point 139a to the −X axis direction is expressed as a negative value. In the vertical axis, positive values indicate tensile stress, while negative values indicate compressive stress. FIG. 5A illustrates results obtained in the connecting portion of the piezoelectric vibrating piece from the following two cases: when the length WR1 of the third side 138c and the length WR2 of the fourth side 138d are the same (WR1=WR2); and when the length WR1 of the third side 138c is formed shorter than the length WR2 of the fourth side 138d (WR1<WR2). Each case describes two results obtained when the long side bend and the short side bend are performed. The lengths WR1 and WR2 obtained from the result in FIG. 5A are as follows. In the case where the length WR1 is equal to the length WR2, the lengths WR1 and WR2 is 0.42 mm. In the case where the length WR1 is shorter than the length WR2, the length WR1 are 0.32 mm and the length WR2 are 0.42 mm. FIG. 5A illustrates the results as follows. The black diamond indicates the long side bend where WR1 is equal to WR2. The white diamond indicates the short side bend where WR1 is equal to WR2. The white circle indicates the long side bend where WR1 is shorter than WR2. The black circle indicates the short side bend where WR1 is shorter than WR2.

In FIG. 5A, the values of the long side bend where WR1 is equal to WR2 (black diamond) and the long side bend where WR1 is shorter than WR2 (white circle) are approximately the same. Namely, the difference in length between WR1 of the third side 138c and WR2 of the fourth side 138d does not significantly affect the values of the long side bend. On the other hand, for the short side bend where WR1 is equal to WR2 (white diamond) and the short side bend where WR1 is shorter than WR2 (black circle), the absolute stress value of the short side bend where WR1 is shorter than WR2 is shorter than that of the short side bend where WR1 is equal to WR2 within the range of approximately −0.5 mm to 0.0 mm position in the X axis direction.

Figure 5B:
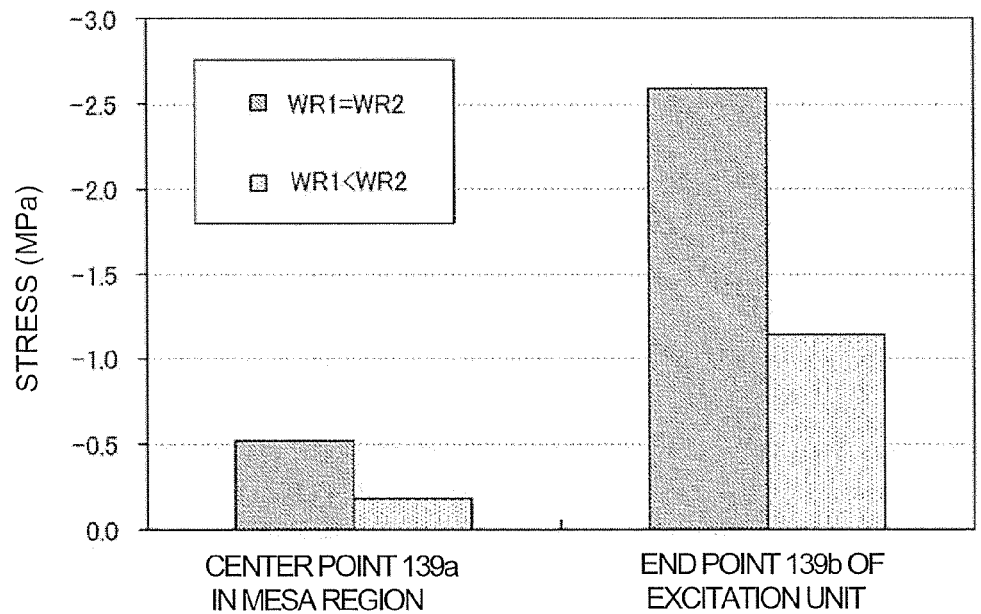
FIG. 5B is a graph illustrating the stresses of a center point 139a in the mesa region 131a and the end point 139b at the −X axis side of the excitation unit 131 in the case where the short side bend is performed in the Z' axis direction.

FIG. 5B is a graph illustrating the stresses of the center point 139a in the mesa region 131a and the end point 139b at the −X axis side of the excitation unit 131 in the case where the short side bend is performed in the Z' axis direction. The point 139a and the point 139b are on the horizontal axis while the stress is on the vertical axis. FIG. 5B illustrates stresses in the respective points in the cases where WR1 is shorter than WR2, and WR1 is equal to WR2. At the center point 139a of the mesa region 131a, the stress is −0.518 MPa in the case where WR1 is equal to WR2, and the stress is −0.183 MPa in the case where WR1 is shorter than WR2. At the end point 139b of the excitation unit 131, the stress is −2.591 MPa in the case where WR1 is equal to WR2, and the stress is −1.143 MPa in the case where WR1 is shorter than WR2. At the center point 139a of the mesa region 131a and the end point 139b of the excitation unit 131, the stress where WR1 is shorter than WR2 has a smaller absolute value than that of the stress where WR1 is equal to WR2. At the center point 139a of the mesa region 131a, the stress where WR1 is shorter than WR2 has the intensity of stress that is reduced by 65% compared with that of the stress where WR1 is equal to WR2. At the end point 139b of the excitation unit 131, the stress where WR1 is shorter than WR2 has the intensity of stress that is reduced by 56% compared with that of the stress where WR1 is equal to WR2.

The simulation demonstrated that the length of the third side that is shorter than that of the fourth side in the connecting portion 133 of the piezoelectric vibrating piece 130 reduces the stress applied to the excitation unit 131. In the case where only the length of the third side in the piezoelectric vibrating piece 130 is formed shorter, the connecting portion 133 appears to have higher resistance to impact compared with the case where the length of the whole connecting portion in the Z' axis direction is formed shorter (that is, both the third side and the fourth side are formed shorter). This enables the excitation unit 131 to be less stressed without significantly decreasing the impact resistance of the piezoelectric vibrating piece 130. This prevents the change in characteristics, such as the vibration frequency of a piezoelectric vibrating piece.

Modification of the Piezoelectric Vibrating Piece 130

The connecting portion 133 of the piezoelectric vibrating piece 130 may be formed thicker than the peripheral region 131b. Additionally, the connecting portion 133 may include an auxiliary connecting portion. The connecting portion 133 may have side surfaces, which is recessed toward the connecting portion, at the +Z' axis side and the −Z' axis side. Hereinafter, a description will be given of a piezoelectric vibrating piece 230 and a piezoelectric vibrating piece 330. The piezoelectric vibrating piece 230 includes the thicker connecting portion and the auxiliary connecting portion. The piezoelectric vibrating piece 330 includes a connecting portion where side surfaces at the +Z' axis side and the −Z' axis side are recessed toward the connecting portion. In the following description, like reference numerals designate corresponding or identical elements of the piezoelectric vibrating piece 130, and therefore such elements will not be further elaborated here.

Piezoelectric Vibrating Piece 230

Figure 6A:
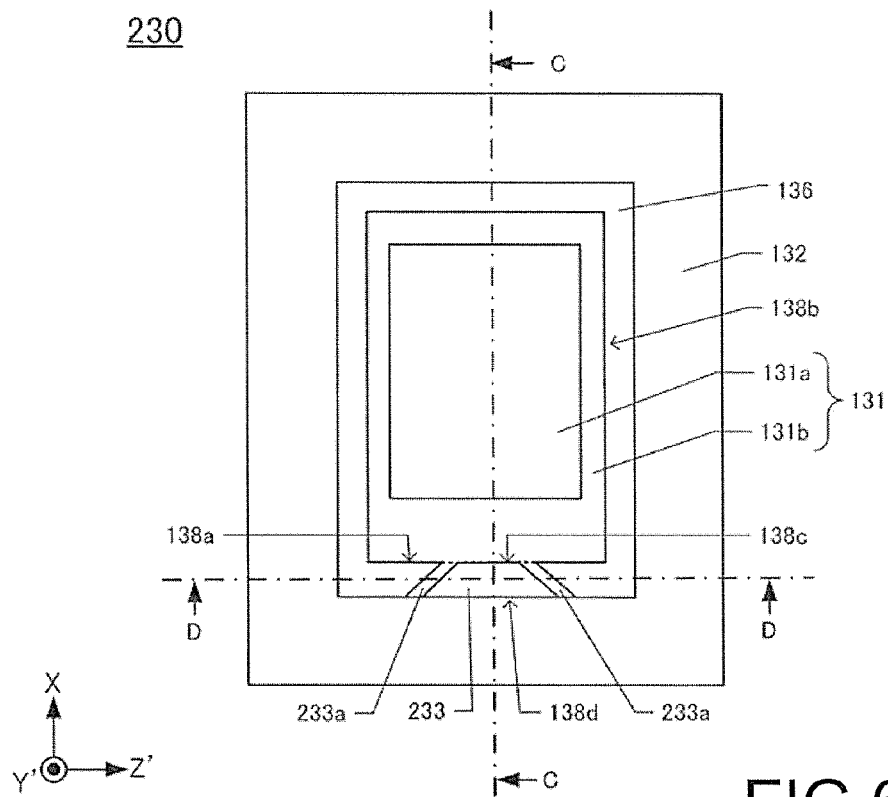
FIG. 6A is a plan view of a piezoelectric vibrating piece 230 without electrodes.

FIG. 6A is a plan view of a piezoelectric vibrating piece 230 without electrodes. The piezoelectric vibrating piece 230 includes the excitation unit 131, the framing portion 132 which surrounds the excitation unit 131, a connecting portion 233, and auxiliary connecting portions 233a. The connecting portion 233 connects the framing portion 132 to the excitation unit 131. The auxiliary connecting portions 233a are formed on side surfaces of the connecting portion 233 at the +Z' axis side and the −Z' axis side. The connecting portion 233 is connected to the center of the first side 138a, which is the side of the excitation unit 131 at the −X axis side. The third side 138c, which is the side of the connecting portion 233 at the +X axis side, is formed shorter than the fourth side 138d, which is the side of the connecting portion 233 at the −X axis side. The connecting portion 233 includes the auxiliary connecting portions 233a on the side surfaces at the +Z' axis side and the −Z' axis side. The auxiliary connecting portions 233a are also connected to the first side 138a and the framing portion 132.

Figure 6B:
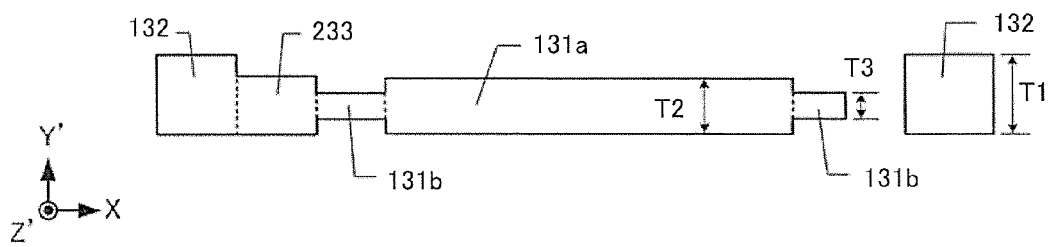
FIG. 6B is a cross-sectional view taken along the line C-C of FIG. 6A.

FIG. 6B is a cross-sectional view taken along the line C-C of FIG. 6A. The piezoelectric vibrating piece 230 includes the framing portion 132 with the thickness T1. The piezoelectric vibrating piece 230 has the mesa region 131a and the connecting portion 233 which have the thickness T2. The piezoelectric vibrating piece 230 has the peripheral region 131b with the thickness T3. In the piezoelectric vibrating piece 230, for example, when a frequency is 40 MHz, the thickness T2 is formed to be 41.75 µm.

Figure 6C:
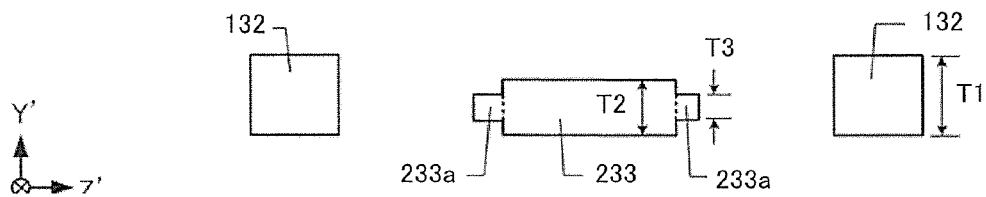
FIG. 6C is a cross-sectional view taken along the line D-D of FIG. 6A.

FIG. 6C is a cross-sectional view taken along the line D-D of FIG. 6A. The piezoelectric vibrating piece 230 includes the auxiliary connecting portion 233a with the thickness T3, which is the same thickness as that of the peripheral region 131b. The difference in level between the auxiliary connecting portion 233a and the connecting portion 233 is 4 µm.

The piezoelectric vibrating piece 230 includes the connecting portion 233 that is thicker than the peripheral region 131b, and also includes the auxiliary connecting portions 233a. This configuration reduces damage on the connecting portion 233, thus improving resistance to impact in the piezoelectric vibrating piece 230. Only one of the connecting portion 233, which is thicker than the peripheral region 131b, and the auxiliary connecting portions 233a may be provided. The connecting portion 233 and the auxiliary connecting portions 233a do not need to have the same thickness as that of the mesa region 131a and the peripheral region 131b. However, the piezoelectric vibrating piece 230 may be formed as follows. The connecting portion 233 and the auxiliary connecting portion 233a have the same thickness as that of the mesa region 131a and the peripheral region 131b. Differences in level between the connecting portion 233 and the peripheral region 131b and between the connecting portion 233 and the auxiliary connecting portion 233a have the same height as that of difference in level between the mesa region 131a and the peripheral region 131b. This configuration allows the connecting portion 233 to be formed by the same process as that for the mesa region 131a, and the auxiliary connecting portion 233a to be formed by the same process as that for the peripheral region 131b. This is preferred.

Piezoelectric Vibrating Piece 330

Figure 7A:
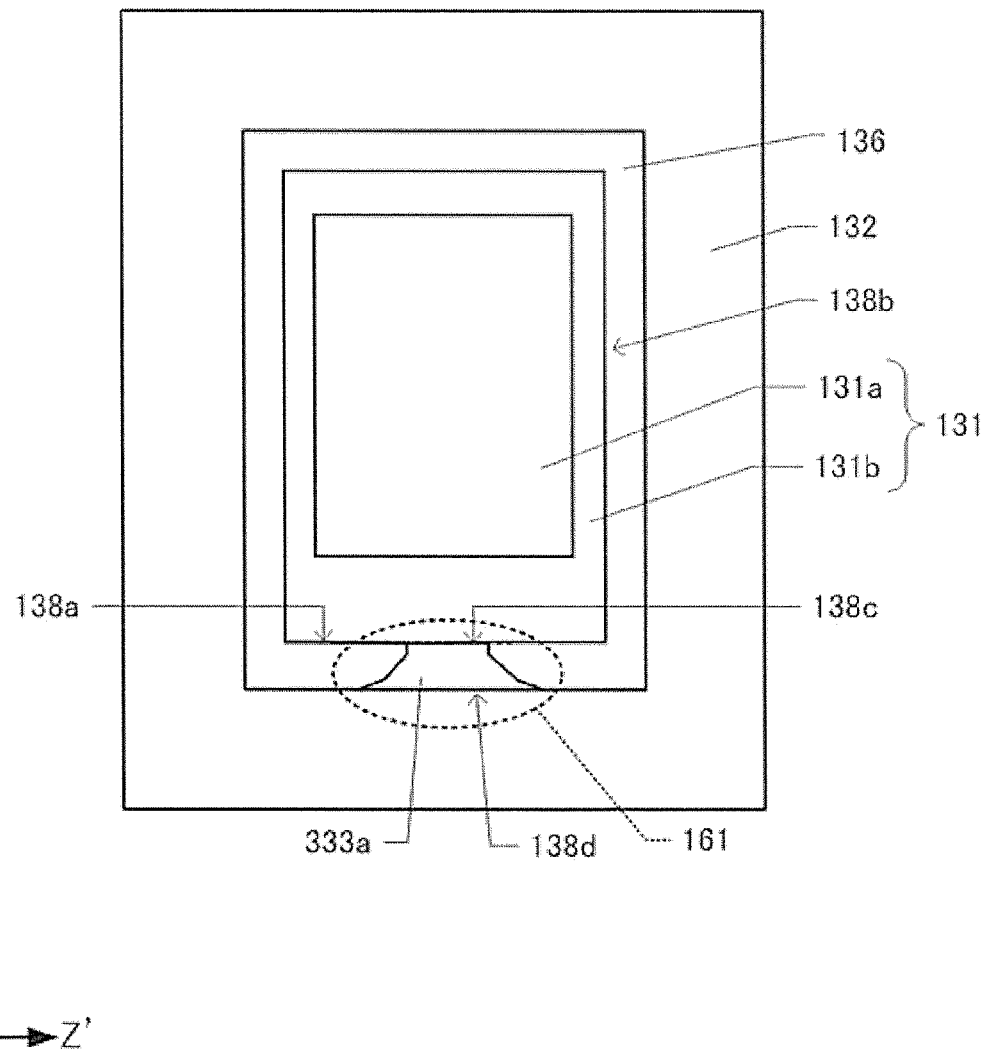
FIG. 7A is a plan view of a piezoelectric vibrating piece 330 without electrodes.

FIG. 7A is a plan view of a piezoelectric vibrating piece 330 without electrodes. The piezoelectric vibrating piece 330 includes the excitation unit 131 in a rectangular shape, the framing portion 132 which surrounds the excitation unit 131, and a connecting portion 333a which connects the excitation unit 131 to the framing portion 132. The connecting portion 333a includes the third side 138c which is the side at the +X axis side, and the fourth side 138d which is the side at the −X axis side and longer than the third side 138c. In the connecting portion 333a, the third side 138c is connected to the center of the first side 138a in the excitation unit 131. The fourth side 138d then extends in the −X axis direction and is connected to the framing portion 132.

Figure 7B:
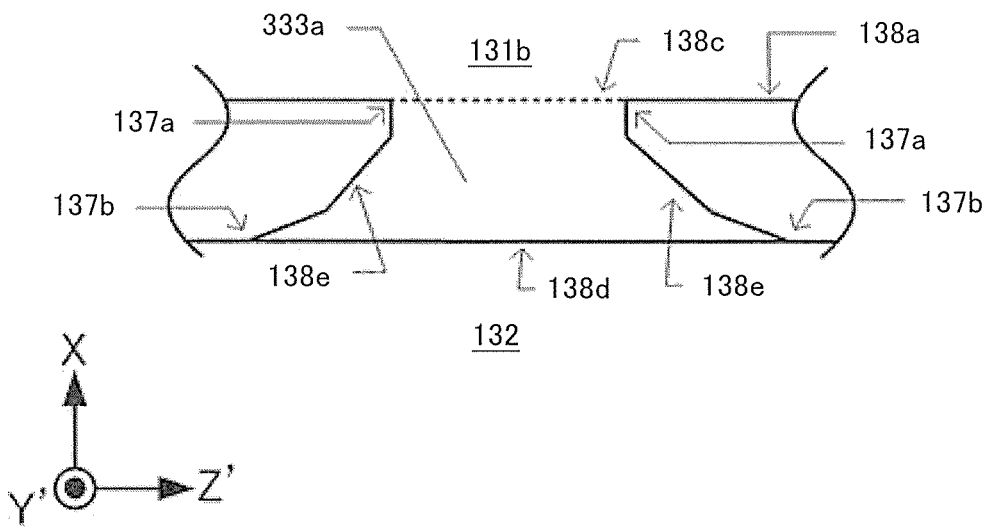
FIG. 7B is an enlarged view of a portion enclosed by the dotted line 161 of FIG. 7A.

FIG. 7B is an enlarged view of a portion enclosed by the dotted line 161 of FIG. 7A. The connecting portion 333a has a planar shape that includes two polygonal lines 138e. One polygonal line 138e connects the end of the third side 138c at the −X axis side to the end of the fourth side 138d at the −X axis side. The other polygonal line 138e connects the end of the third side 138c at the +X axis side to the end of the fourth side 138d at the +X axis side. The respective polygonal lines 138e are recessed toward the connecting portion 333a. The piezoelectric vibrating piece is subjected to stress concentrated on a corner portion that is recessed at an acute angle, thus being easily damaged. The piezoelectric vibrating piece 330 includes the corner portion 137a and the corner portion 137b. The corner portion 137a is formed of the first side 138a and the polygonal line 138e. The corner portion 137b is formed of the framing portion 132 and the polygonal line 138e. The corner portion 137a and the corner portion 137b have respective large angles. These large angles inhibit respective stress concentrations on the corner portion 137a and the corner portion 137b. This prevents damage on the piezoelectric vibrating piece.

Figure 7C:
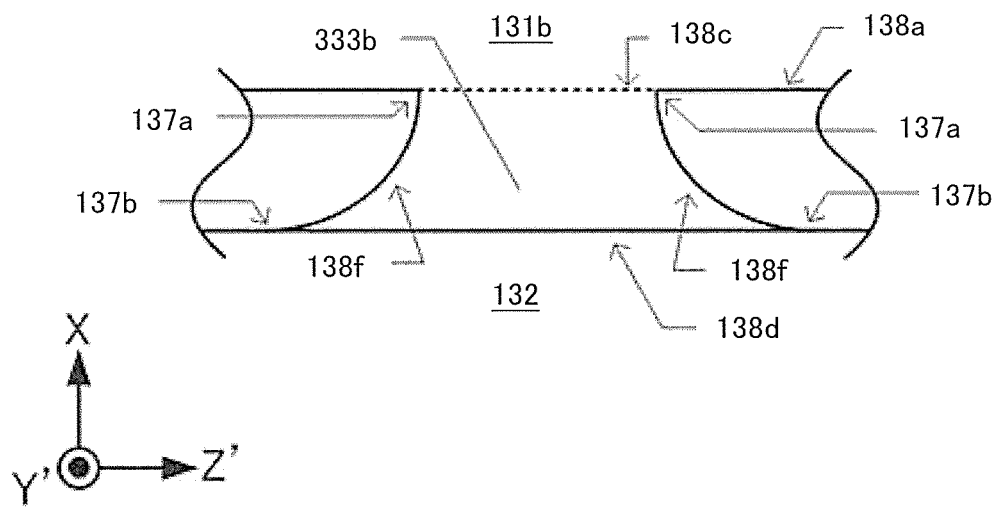
FIG. 7C is a plan view of a connecting portion 333b.

FIG. 7C is a plan view of a connecting portion 333b. The piezoelectric vibrating piece 330 in FIG. 7A may include a connecting portion 333b instead of the connecting portion 333a. The connecting portion 333b includes the third side 138c which is the side at the +X axis side, and the fourth side 138d which is the side at the −X axis side and longer than the third side 138c. The third side 138c is connected to the center of the first side 138a in the excitation unit 131. The fourth side 138d then extends in the −X axis direction and is connected to the framing portion 132. The connecting portion 333b has a planar shape that includes two curved lines 138f. One curved line 138f connects the end of the third side 138c at the −X axis side to the end of the fourth side 138d at the −X axis side. The other curved line 138f connects the end of the third side 138c at the +X axis side to the end of the fourth side 138d at the +X axis side. The respective curved lines 138f are recessed toward the connecting portion 333b. Similarly, even in the case where the connecting portion 333b is formed instead of the connecting portion 333a, stress is not easily concentrated on the corner portion 137a and the corner portion 137b. This prevents damage on the piezoelectric vibrating piece.

Second Embodiment

The connecting portion in the piezoelectric vibrating piece may be formed so that the fourth side in the −X axis side of the connecting portion may be shorter than the third side in the +X axis side of the connecting portion. The piezoelectric vibrating piece 430 where the fourth side is formed shorter than the third side will be described. In the following description, like reference numerals designate corresponding or identical elements of the first embodiment, and therefore such elements will not be further elaborated here.

Simulation Results of the Piezoelectric Vibrating Piece 430

In the case where the piezoelectric devices are mounted on printed circuit boards, simulations were performed to calculate stresses on the piezoelectric vibrating piece 430 when the printed circuit boards are bent. The simulations were performed assuming two cases: one case (long side bend) where the printed circuit board is bent in the long side direction (X axis direction) of the piezoelectric device 100, and the other case (short side bend) where the printed circuit board is bent in the short side direction (Z' axis direction). The simulation results below describe a stress in the Z' axis direction. A description will be given of the simulation results of the piezoelectric vibrating piece 430 below.

Figure 8A:
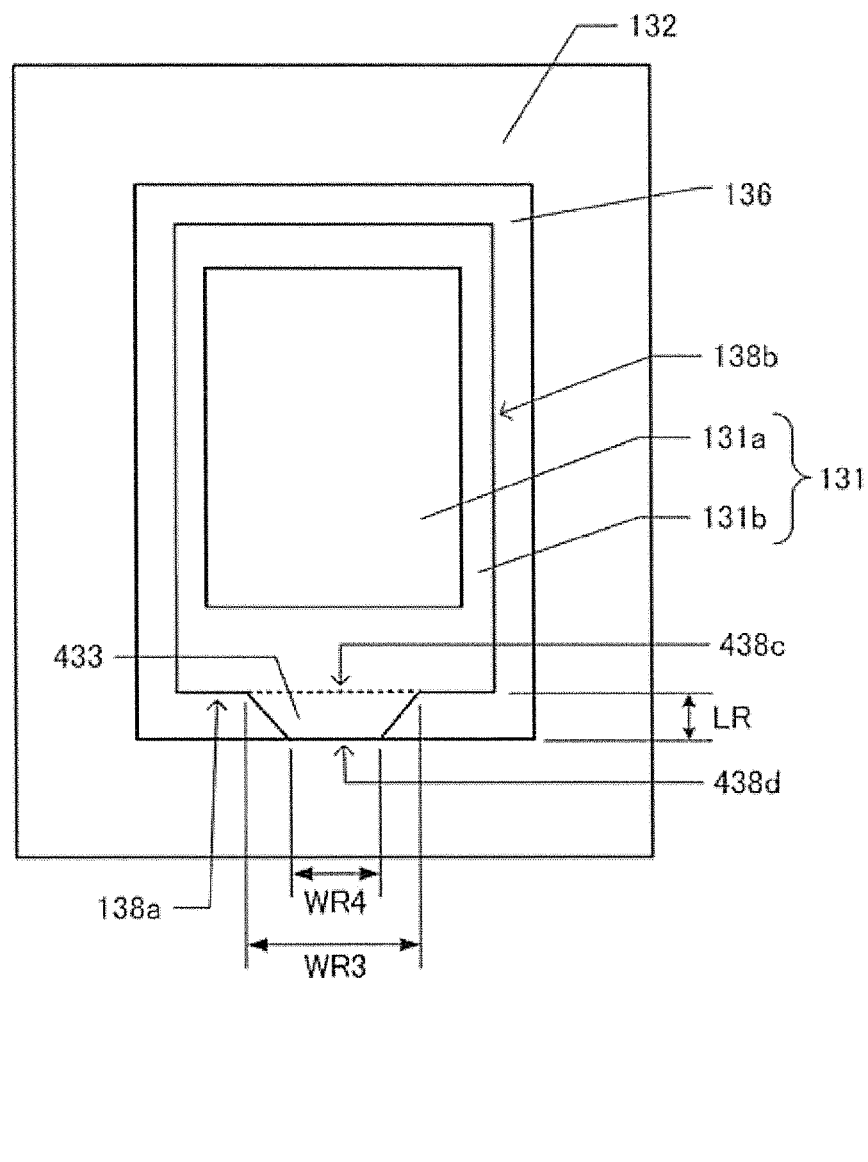
FIG. 8A is a plan view of a piezoelectric vibrating piece 430 without electrodes.

FIG. 8A is a plan view of a piezoelectric vibrating piece 430 without electrodes. The piezoelectric vibrating piece 430 includes the excitation unit 131, the framing portion 132 which surrounds the excitation unit 131, and a connecting portion 433 which connects the excitation unit 131 to the framing portion 132. The excitation unit 131 includes the mesa region 131a and the peripheral region 131b. The peripheral region 131b is formed in the peripheral area of the mesa region 131a, and is thinner than the mesa region 131a in the Y' axis direction. The connecting portion 433 is connected to the center of the first side 138a, which is the side of the excitation unit 131 at the −X axis side. The connecting portion 433 has a fourth side 438d and a third side 438c. The fourth side 438d is the side at the −X axis side, while the third side 438c is the side at the +X axis side. The fourth side 438d is shorter than the third side 438c. The connecting portion 433 has the length LR of 0.2 mm in the X axis direction, the length WR3 of 0.42 mm at the third side 438c, and the length WR4 of 0.32 mm at the fourth side 438d.

Figure 8B:
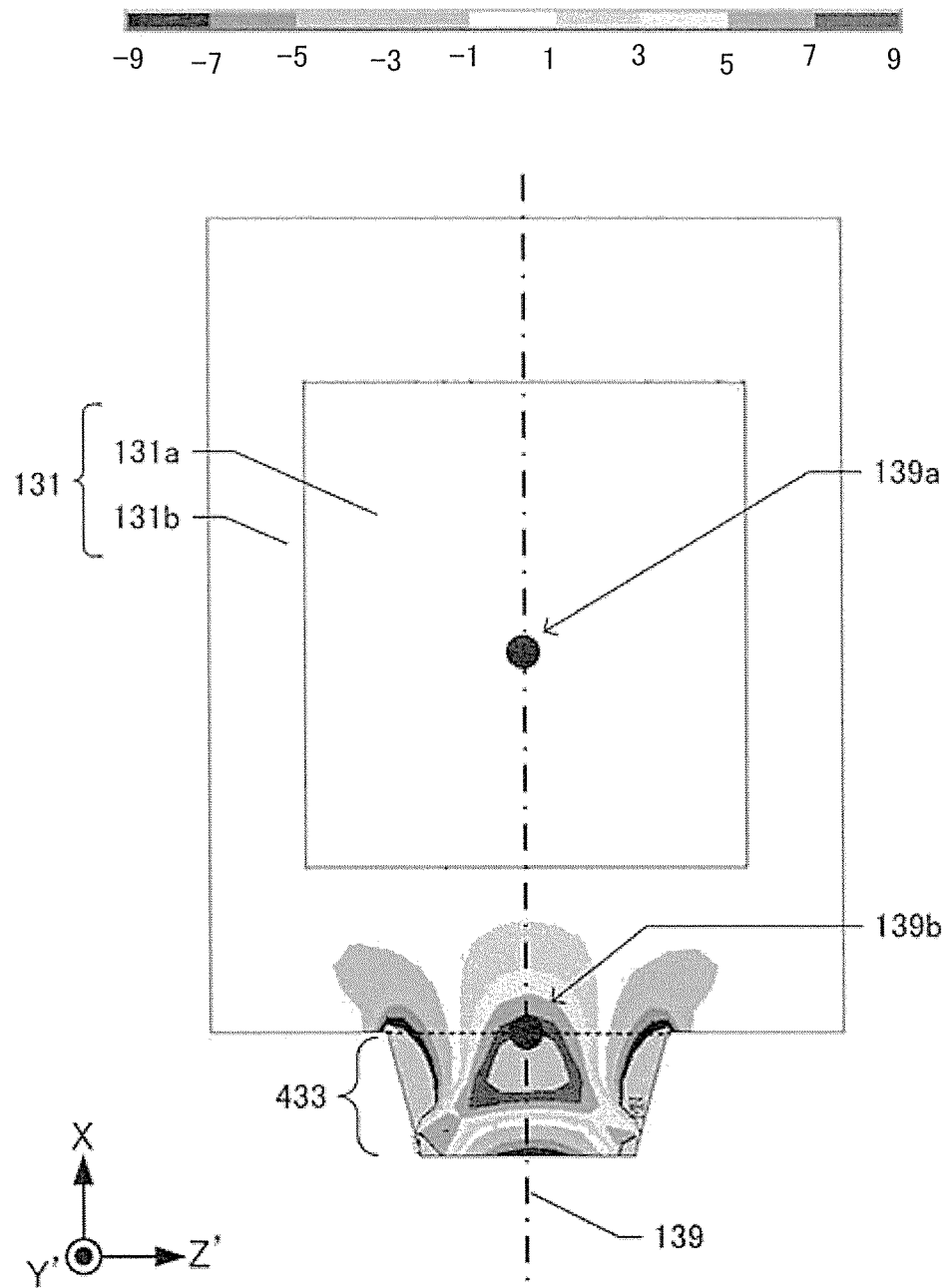
FIG. 8B is a simulation result of a short side bend of the piezoelectric vibrating piece 430.

FIG. 8B is a simulation result of a short side bend of the piezoelectric vibrating piece 430. FIG. 8B illustrates a plan view of the excitation unit 131 and the connecting portion 433 in the piezoelectric vibrating piece 430 alone. FIG. 8B illustrates that the color in the mesa region 131a (white) indicates a portion almost free from stress. Portions with a color darker than the white are in a state where a stress is applied. Additionally, portions with a color close to black are in a state where the largest stress is applied among the excitation unit 131 and the connecting portion 433. In FIG. 8B, the connecting portion 433 has a dark color. It is assumed that a large stress is applied to the connecting portion 433. From the connecting portion 433 to the peripheral region 131b, the region with a thin color (grey region) is extended, indicating that the region where a stress is applied is extended from the connecting portion 433 to the peripheral region 131b. Assume that the center point of the mesa region 131a is a point 139a, the straight line parallel to the X axis and going through the center point 139a is a straight line 139, and a point on the straight line 139 and the end portion at the −X axis side of the excitation unit 131 is a point 139b.

Figure 9A:
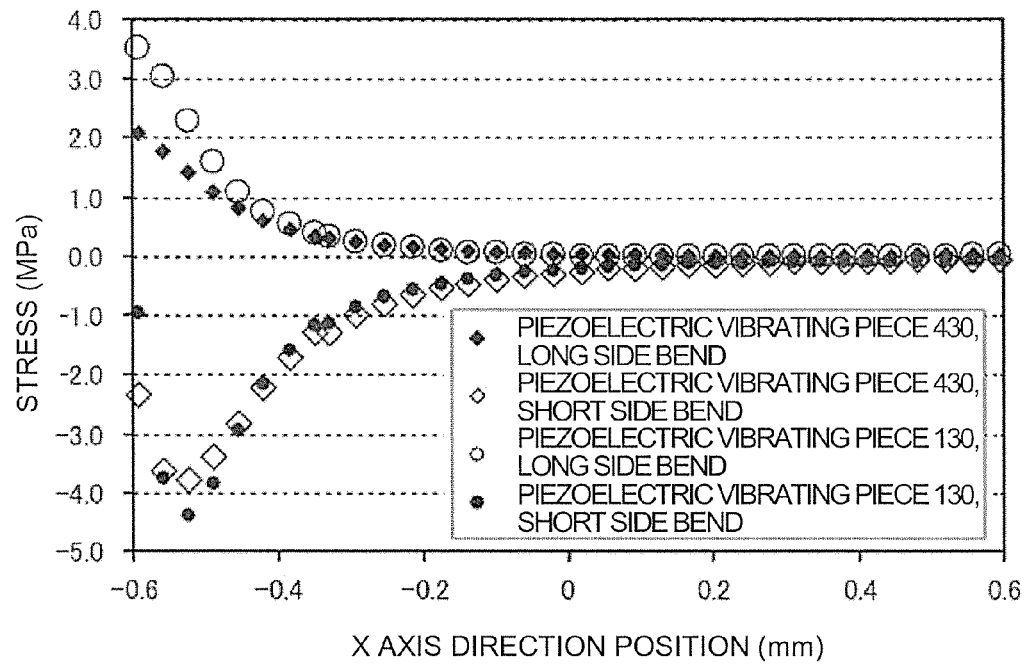
FIG. 9A is a graph illustrating stress distributions of the excitation unit 131 in the piezoelectric vibrating piece 430.

FIG. 9A is a graph illustrating stress distributions of the excitation unit 131 in the piezoelectric vibrating piece 430. For comparison, FIG. 9A also illustrates stress distributions of the excitation unit 131 in the piezoelectric vibrating piece 130. FIG. 9A illustrates the stress distribution on the straight line 139 of FIG. 8B. The horizontal axis indicates a position (mm) in the X axis direction. The vertical axis indicates a stress (MPa). Assume that the point 139a, which is the center point of the mesa region 131a (see FIG. 8B), is 0.0 mm position in the X axis direction. A distance from the point 139a to the +X axis direction is expressed as a positive value. A distance from the point 139a to the −X axis direction is expressed as a negative value. In the vertical axis, a stress represents the stress applied in the Z' axis direction. Positive values indicate tensile stress, while negative values indicate compressive stress. FIG. 9A illustrates results obtained in the piezoelectric vibrating piece 430 and the piezoelectric vibrating piece 130. Each result describes two results where the long side bend and the short side bend are performed. FIG. 9A illustrates the results as follows. The black diamond indicates the long side bend of the piezoelectric vibrating piece 430. The white diamond indicates the short side bend of the piezoelectric vibrating piece 430. The white circle indicates the long side bend of the piezoelectric vibrating piece 130. The black circle indicates the short side bend of the piezoelectric vibrating piece 130.

FIG. 9A illustrates a region with a position in the X axis direction equal to or less than about −0.4 mm. In this region, stress on the piezoelectric vibrating piece 430 in the long side bend (the black diamond) is smaller than the stress on the piezoelectric vibrating piece 130 in the long side bend (the white circle). That is, in the area adjacent to the connecting portion of the excitation unit 131, the piezoelectric vibrating piece 430 undergoes a stress smaller than a stress in the piezoelectric vibrating piece 130 when the long side bend is performed. On the other hand, when the short side bend is performed, stress distributions of the piezoelectric vibrating piece 430 and the piezoelectric vibrating piece 130 have similar tendencies.

Figure 9B:
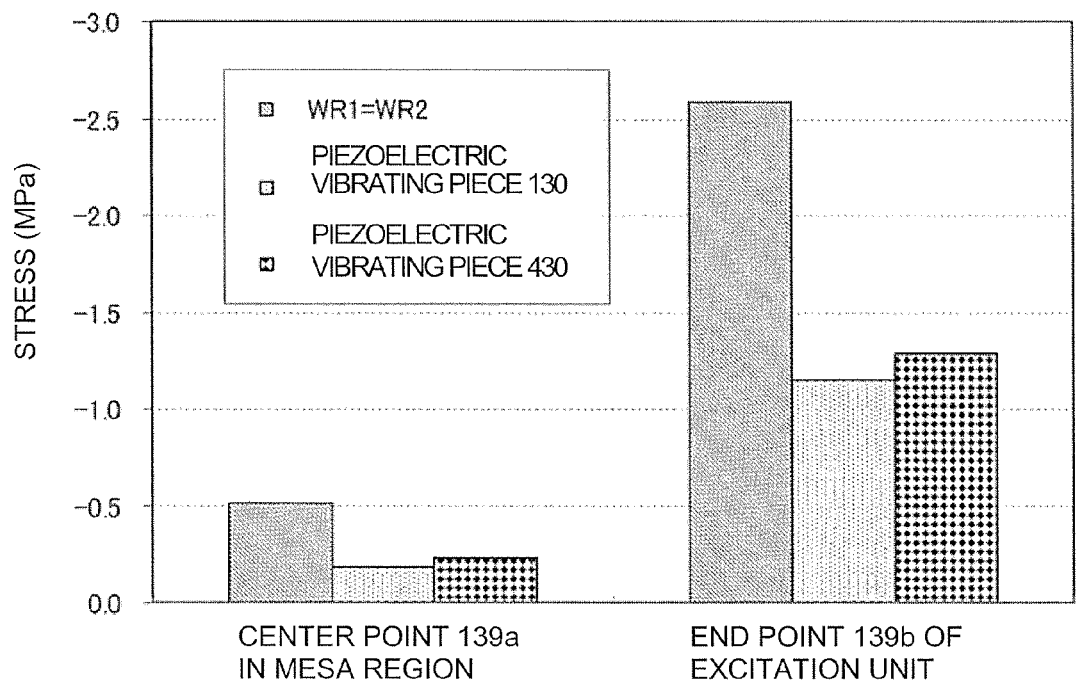
FIG. 9B is a graph illustrating the stresses of the center point 139a in the mesa region 131a and the end point 139b at the −X axis side of the excitation unit 131 in the case where the short side bend is performed in the Z' axis direction.

FIG. 9B is a graph illustrating the stresses on the center point 139a in the mesa region 131a and the stress on the end point 139b at the −X axis side of the excitation unit 131 in the piezoelectric vibrating piece 430 in the case where the short side bend is performed in the Z' axis direction. For comparison, FIG. 9B also illustrates the result in the case where WR1 is equal to WR2 (which is 0.42 mm) and the result in the case of the piezoelectric vibrating piece 130 in FIG. 5B. In FIG. 9B, the center point 139a of the mesa region and the end point 139b of the excitation unit are on the horizontal axis. Stress in the Z' axis direction in the short side bend is on the vertical axis. The center point 139a of the mesa region 131a undergoes stress of −0.518 MPa in the case where WR1 is equal to WR2. The piezoelectric vibrating piece 130 undergoes stress of −0.183 MPa. The piezoelectric vibrating piece 430 undergoes stress of −0.226 MPa. The end point 139b of the excitation unit 131 undergoes stress of −2.591 MPa in the case where WR1 is equal to WR2. The piezoelectric vibrating piece 130 undergoes stress of −1.143 MPa. The piezoelectric vibrating piece 430 undergoes stress of −1.284 MPa. The piezoelectric vibrating piece 430 undergoes stresses on the center point 139a of the mesa region 131a and the end point 139b of the excitation unit 131. These stresses are slightly higher than stress on the piezoelectric vibrating piece 130 but smaller than stress in the case where WR1 is equal to WR2. Comparison of the stress on the piezoelectric vibrating piece 430 with the stress in the case where WR1 is equal to WR2 indicates as follows. The stress on the center point 139a of the mesa region 131a has an intensity that is reduced by about 56%. The stress on the end point 139b of the excitation unit 131 has an intensity that is reduced by about 50%.

Figure 10A:
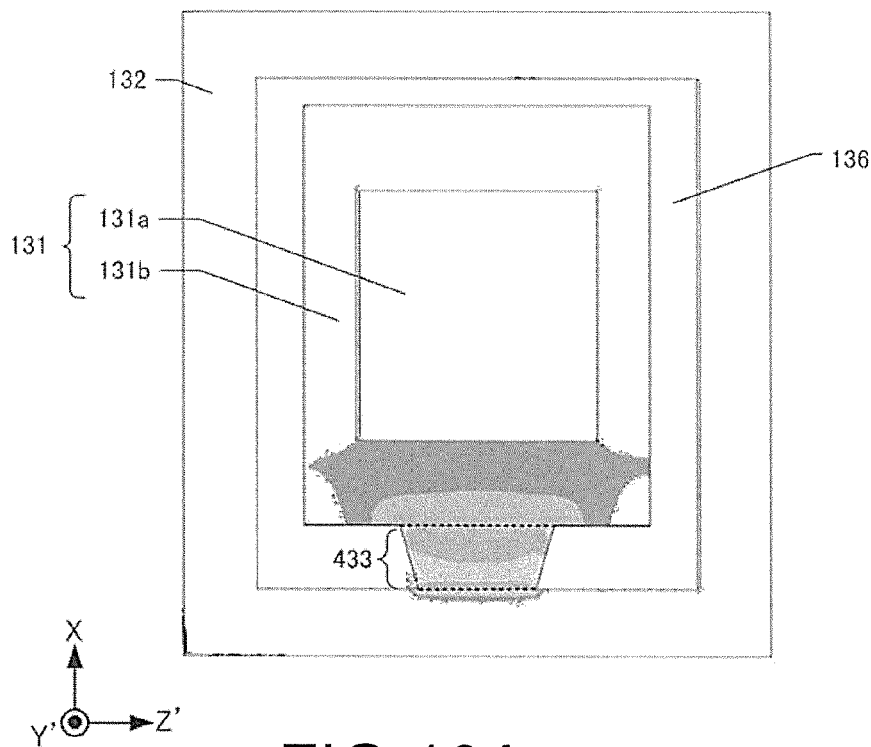
FIG. 10A is a simulation result of a stress applied by a drop of the piezoelectric vibrating piece 430.

FIG. 10A is a simulation result of a stress applied by a drop of the piezoelectric vibrating piece 430. FIG. 10A illustrates stress on the piezoelectric vibrating piece in the Z' axis direction component when the piezoelectric device is dropped. In FIG. 10A, almost no stress is applied to a white region. The highest stress is applied to a black region. Stress lower than that of the black region is applied to the gray region. In FIG. 10A, stress is applied to the connecting portion 433 as the center. When the piezoelectric device is dropped, stress is applied to the connecting portion 433 as the center.

Figure 10B:
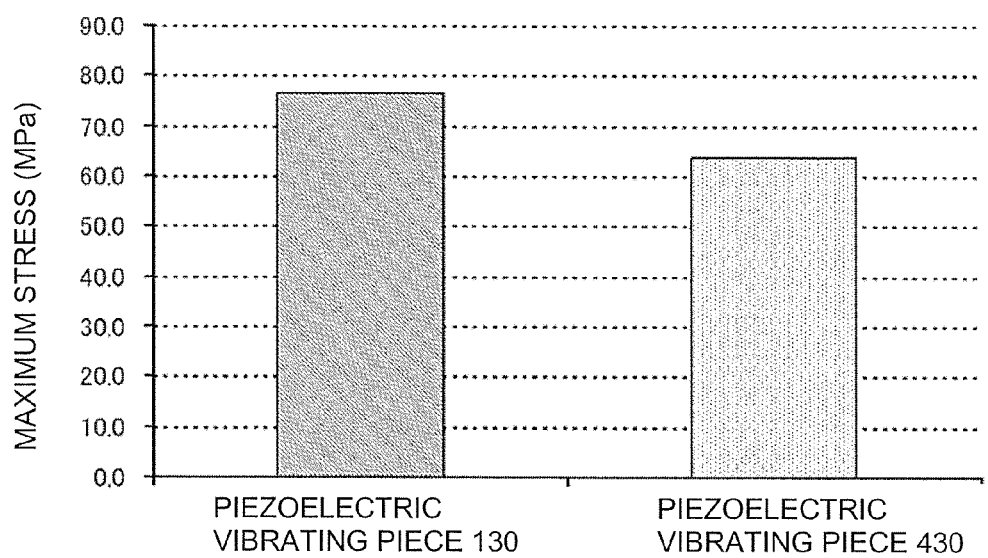
FIG. 10B is a graph illustrating the maximum stresses applied by a drop of the piezoelectric vibrating piece 130 and the piezoelectric vibrating piece 430.

FIG. 10B is a graph illustrating the maximum stresses applied by a drop of the piezoelectric vibrating piece 130 and the piezoelectric vibrating piece 430. The maximum stress is 76.437 MPa when the piezoelectric vibrating piece 130 is dropped, while the maximum stress is 63.674 MPa when the piezoelectric vibrating piece 430 is dropped. As illustrated in FIG. 10A, since these stresses are applied to the connecting portion that has the lowest resistance to impact in the piezoelectric vibrating piece, it is preferred that the stresses be small. The maximum stress on the piezoelectric vibrating piece 430 is reduced by about 17% compared with the maximum stress on the piezoelectric vibrating piece 130.

The simulation demonstrated that the length of the fourth side 438d that is shorter than that of the third side 438c in the connecting portion 433 of the piezoelectric vibrating piece 430 reduces the bending stress applied to the excitation unit 131 (see FIG. 9B). The maximum stress applied to the connecting portion in the piezoelectric vibrating piece 430 that is less than that applied to the connecting portion of the piezoelectric vibrating piece 130 possibly causes the piezoelectric vibrating piece 430 to be more resistant against drop impact than the piezoelectric vibrating piece 130 (see FIG. 10B). The connecting portion 433 in the piezoelectric vibrating piece 430 has the fourth side 438d that is shorter than the third side 438c. This enables the excitation unit 131 to be less stressed without significantly decreasing the impact resistance of the piezoelectric vibrating piece 430. This consequently prevents the change in characteristics, such as the vibration frequency of a piezoelectric vibrating piece.

Representative embodiments have been described in detail above. As evident to those skilled in the art, this disclosure may be changed or modified in various ways within the technical scope of this disclosure.

While in the embodiments the piezoelectric vibrating pieces employs an AT-cut quartz-crystal vibrating pieces, a BT-cut quartz-crystal vibrating pieces, which vibrate in a thickness-shear vibration mode, or a similar piece may also be used, similarly to the AT-cut quartz-crystal vibrating pieces. Further, the piezoelectric vibrating pieces are basically applied to piezoelectric material including not only quartz-crystal material but also lithium tantalite, lithium niobate, and piezoelectric ceramic.

According to a second aspect of the piezoelectric vibrating piece in the first aspect, the number of the connecting portion is one. The connecting portion is connected to the center of the first side in the excitation unit.

According to a third aspect of the piezoelectric vibrating piece in the first or second aspect, the excitation unit includes a mesa region and a peripheral region around the mesa region. The excitation electrode is formed in the mesa region. A thickness of the peripheral region is thinner than a thickness of the mesa region.

According to a fourth aspect of the piezoelectric vibrating piece in the third aspect, a thickness of the peripheral region is thinner than a thickness of the connecting portion.

According to a fifth aspect of the piezoelectric vibrating piece in the third aspect, a thickness of the peripheral region and a thickness of the connecting portion are same.

According to a sixth aspect of the piezoelectric vibrating piece in the first to fifth aspects, the connecting portion includes one of a curved line and a polygonal line. One of the curved line and the polygonal line is recessed toward the connecting portion. The connecting portion connects an end portion of the third side to an end portion of the fourth side.

According to a seventh aspect of the piezoelectric vibrating piece in the first to fourth aspects, an auxiliary connecting portion is formed on a side surface of the connecting portion in the first direction. The auxiliary connecting portion connects the excitation unit to the framing portion. A thickness of the auxiliary connecting portion is thinner than a thickness of the connecting portion.

According to an eighth aspect of the piezoelectric vibrating piece in the seventh aspect, the auxiliary connecting portion has the same thickness as a thickness of the excitation unit with the first side.

The piezoelectric device according to a ninth aspect includes a piezoelectric vibrating piece according to the first to eighth aspects, a lid plate bonded to one principal surface of the framing portion in the piezoelectric vibrating piece, and a base plate bonded to the other principal surface of the framing portion in the piezoelectric vibrating piece.

The piezoelectric vibrating piece and the piezoelectric device reduces the influence of stress on the excitation unit.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:
1. A piezoelectric vibrating piece, comprising:
an excitation unit in a rectangular shape, the excitation unit including:
a pair of principal surfaces;
a pair of excitation electrodes, formed on the pair of principal surfaces;
a first side that extends in a first direction;

a second side that extends in a second direction, the second side being longer than the first side, the second direction being perpendicular to the first direction;
a framing portion, surrounding the excitation unit; and
a connecting portion, connecting the excitation unit to the framing portion, the connecting portion having a third side and a fourth side, the third side being connected to the first side and extending in the first direction, the fourth side being connected to the framing portion and extending in the first direction, a thickness of the connecting portion being thinner than a thickness of the framing portion, wherein,
the third side has a different length from that of the fourth side.

2. The piezoelectric vibrating piece according to claim 1, wherein,
the number of the connecting portion is one,
the connecting portion being connected to the center of the first side in the excitation unit.

3. The piezoelectric vibrating piece according to claim 1, wherein,
the excitation unit includes a mesa region and a peripheral region around the mesa region,
the excitation electrode is formed in the mesa region, and
a thickness of the peripheral region being thinner than a thickness of the mesa region.

4. The piezoelectric vibrating piece according to claim 3, wherein,
a thickness of the peripheral region is thinner than a thickness of the connecting portion.

5. The piezoelectric vibrating piece according to claim 3, wherein,
a thickness of the peripheral region and a thickness of the connecting portion are same.

6. The piezoelectric vibrating piece according to claim 1, wherein,
the connecting portion includes one of a curved line and a polygonal line,
one of the curved line and the polygonal line being recessed toward the connecting portion,
the connecting portion connecting an end portion of the third side to an end portion of the fourth side.

7. The piezoelectric vibrating piece according to claim 1, further comprising:
an auxiliary connecting portion, formed on a side surface of the connecting portion in the first direction,
the auxiliary connecting portion connecting the excitation unit to the framing portion,
a thickness of the auxiliary connecting portion being thinner than a thickness of the connecting portion.

8. The piezoelectric vibrating piece according to claim 7, wherein,
the auxiliary connecting portion has a same thickness as a thickness of the excitation unit with the first side.

9. A piezoelectric device, comprising:
a piezoelectric vibrating piece according to claim 1;
a lid plate bonded to one principal surface of the framing portion in the piezoelectric vibrating piece;
a base plate bonded to the other principal surface of the framing portion in the piezoelectric vibrating piece.

* * * * *